US008367555B2

(12) United States Patent
Afzali-Ardakani et al.

(10) Patent No.: US 8,367,555 B2
(45) Date of Patent: Feb. 5, 2013

(54) REMOVAL OF MASKING MATERIAL (75) Inventors: Ali Afzali-Ardakani, Ossining, NY (US); Emanuel Israel Cooper, Scarsdale, NY (US); Mahmoud Khojasteh, Poughkeepsie, NY (US); Ronald W. Nunes, Hopewell Junction, NY (US); George Gabriel Totir, Newtown, CT (US)

(73) Assignees: International Business Machines Corporation, Armonk, NY (US); Advanced Technology Materials, Inc., Danbury, CT (US)

( * ) Notice: Subject to any disclaimer, the term of this patent is extended or adjusted under 35 U.S.C. 154(b) by 162 days.

(21) Appl. No.: 12/636,015

(22) Filed: Dec. 11, 2009

(65) Prior Publication Data
US 2011/0140181 A1    Jun. 16, 2011

(51) Int. Cl.
*H01L 21/302* (2006.01)
(52) U.S. Cl. ........ 438/745; 438/669; 438/686; 438/689; 438/692; 438/708; 438/709
(58) Field of Classification Search ............... 437/21, 437/41; 438/669, 689, 708, 745, FOR. 132, 438/239, 686, 692, 709
See application file for complete search history.

(56) References Cited

U.S. PATENT DOCUMENTS

| 5,545,576 | A | * | 8/1996 | Matsumoto et al. | 438/160 |
| 5,726,477 | A | * | 3/1998 | Williams et al. | 257/402 |
| 5,985,522 | A | * | 11/1999 | Iwasa et al. | 430/315 |
| 6,162,565 | A | | 12/2000 | Chao et al. | |
| 6,758,912 | B2 | * | 7/2004 | Chao et al. | 134/3 |
| 2001/0024852 | A1 | * | 9/2001 | Aoki et al. | 438/239 |
| 2002/0077259 | A1 | | 6/2002 | Skee | |
| 2003/0003754 | A1 | | 1/2003 | Yokoi et al. | |
| 2003/0051740 | A1 | * | 3/2003 | Chao et al. | 134/3 |
| 2003/0186175 | A1 | | 10/2003 | Ikemoto et al. | |
| 2004/0211753 | A1 | * | 10/2004 | Shimizu et al. | 216/26 |

FOREIGN PATENT DOCUMENTS

| JP | 2002064101 A | | 2/2002 |
| JP | 2006-017843 | * | 1/2006 |

* cited by examiner

*Primary Examiner* — Long Tran
(74) *Attorney, Agent, or Firm* — Tristan A. Fuierer; Moore & Van Allen, PLLC; Rosa Yaghmour (57) ABSTRACT Methods for removing a masking material, for example, a photoresist, and electronic devices formed by removing a masking material are presented. For example, a method for removing a masking material includes contacting the masking material with a solution comprising cerium. The cerium may be comprised in a salt. The salt may be cerium ammonium nitrate.

38 Claims, 4 Drawing Sheets

REMOVAL OF MASKING MATERIAL

FIELD OF THE INVENTION

The present invention relates generally to removing a masking material and, more particularly, to removing a masking material using a solution comprising cerium.

BACKGROUND OF THE INVENTION

Resist, including photoresist, is a radiation sensitive (e.g., light radiation sensitive) material used to form a patterned layer on a substrate (e.g., a semiconductor wafer) during semiconductor device fabrication. After exposing a portion of a resist coated substrate to radiation, either the exposed portion of the resist (for positive resist), or the unexposed portion of the resist (for negative resist) is removed to reveal the underlying surface of the substrate, leaving the rest of the surface of the substrate coated and protected by resist. Resist may be more generally referred to as a masking material. Other fabrication processes such as ion-implanting, etching, or depositing may be performed on the uncovered surface of the substrate and the remaining resist. After performing the other fabrication processes, the remaining resist is removed in a strip operation.

In ion-implantation, dopant ions (e.g., ions of boron, boron difluoride, arsenic, indium, gallium, thallium, phosphorous, germanium, antimony, xenon or bismuth) are accelerated toward a substrate to be implanted. The ions are implanted in the exposed regions of the substrate as well as in the remaining resist. Ion-implantation may be used, for example, to form implanted regions in the substrate such as the channel region and source and drain regions of transistors. Ion-implantation may also be used to form lightly doped drain and double diffused drain regions. However, ions implanted in the resist may deplete hydrogen from the surface of the resist causing the resist to form an outer layer or crust, which may be a carbonized layer that is harder than the underlying portion of the resist layer (i.e., the bulk portion of the resist layer). The outer layer and the bulk portion have different thermal expansion rates and react to stripping processes at different rates. High dose ion-implanted resist may cause severe hardening or crusting of the resist resulting in relatively large differences between the outer layer and bulk portion in, for example, differences in thermal expansion rates, solubilities and other chemical and physical characteristics.

One type of transistor is known as a field-effect-transistor (FET). An FET may also be known as a metal-oxide-semiconductor FET (MOSFET), although MOSFET is a misnomer for FETs having a silicon gate instead of a metal gate. FET transistors comprise a source region, a drain region, a channel region between the source and drain regions, a gate insulator above the channel region and a gate electrode above the gate insulator. In early FETs from very early technologies, gate electrodes typically comprised metal. In later technologies, gate electrodes typically comprised semiconductor silicon (e.g., in the form of polysilicon). Silicon was used because silicon is compatible with silicon dioxide used as the gate insulator, and because silicon could tolerate high temperatures that were useful for fabricating FETs and integrated circuits that included FETs. However, some very recent technologies are again using metal gate electrodes. Metal has the advantage of having less electrical resistance than polysilicon, thus reducing signal propagation times. Furthermore, in very recent technologies having transistor dimensions that are smaller that dimensions of preceding technologies, it is necessary to make the gate dielectric layer very thin (e.g., one nanometer). Very thin gate dielectric layers may cause a problem in polysilicon gate electrodes, called poly depletion, where a depletion layer is formed in the gate polysilicon electrode next to the gate dielectric when the channel region of the transistor is in inversion. To avoid poly depletion, a metal gate is desired. A variety of metal gates materials may be used, usually in conjunction with relatively high dielectric constant gate insulator materials, known as high-k dielectrics. Examples of metal gate materials include tantalum, tungsten, tantalum nitride, and titanium nitride (TiN).

SUMMARY OF THE INVENTION

Principles of the invention provide, for example, methods for removing a masking material and devices formed by removing a masking material.

In accordance with one aspect of the invention, a method for removing a masking material comprises contacting the masking material with a solution comprising cerium.

In accordance with another aspect of the invention, an electronic device is formed by removing a masking material by contacting the masking material with a solution comprising cerium.

In accordance with an additional aspect of the invention, a method for removing photoresist from a substrate comprises contacting the photoresist with a solution comprising cerium. Prior to contacting the photoresist with the solution, it is assumed that the photoresist has been ion-implanted by greater than approximately $5 \times 10^{14}$ ions per square centimeter, and/or ions having an average energy, before the ions impact the photoresist, greater than approximately five thousand electron volts (5 KeV). The substrate comprises titanium nitride.

In accordance with yet another aspect of the invention, an electronic device is formed by removing photoresist from a substrate. The photoresist is removed by contacting the photoresist with a solution comprising cerium. Prior to contacting the photoresist with the solution, it is assumed that the photoresist has been ion-implanted by greater than approximately $5 \times 10^{14}$ ions per square centimeter, and/or ions having an average energy, before the ions impact the photoresist, greater than approximately 5 KeV. The electronic device comprises titanium nitride.

In accordance with yet an additional aspect of the invention, a method of forming an electronic device comprises forming a substrate comprising titanium nitride, ion-implanting photoresist by greater than approximately $5 \times 10^{14}$ ions per square centimeter, and/or ions having an average energy, before the ions impact the photoresist, greater than approximately 5 KeV, and contacting the photoresist with a solution comprising cerium.

In one or more embodiments of the invention, the masking material comprises resist or photoresist, and the solution used to remove the resist or photoresist comprises cerium ammonium nitrate.

Further embodiments of the invention provide, for example, substantially complete removal of resist that has undergone ion-implantation whereby a hard or difficult to dissolve shell has been formed on the resist. Additional embodiments of the invention provide, for example, a wet-only method of stripping a resist that has received high dose ion-implantation (e.g., high dose ion-implantation strip or HDIS), wherein the wet-only method does not require using any plasma-related steps or any vacuum-related steps.

These and other features, objects and advantages of the present invention will become apparent from the following detailed description of illustrative embodiments thereof, which is to be read in connection with the accompanying drawings.

DETAILED DESCRIPTION OF THE INVENTION

Principles of the present invention will be described herein in the context of illustrative methods for removing resists. It is to be appreciated, however, that the principles of the present invention are not limited to the specific methods and devices illustratively shown and described herein. Rather, the principles of the invention are directed broadly to techniques for removal of masking materials. For this reason, numerous modifications can be made to the embodiments shown that are within the scope of the present invention. That is, no limitations with respect to the specific embodiments described herein are intended or should be inferred.

Ion-implantation is a process by which ions of a dopant material can be implanted into target material, usually a solid. The physical properties of an ion-implanted material are usually different from the physical properties of the target material prior to implantation. Ion-implantation is used in semiconductor device fabrication, for example, in the fabrication of integrated circuits and silicon semiconductor devices. The implanted ions may introduce or cause a chemical change in the target due to the ions being a different element than the target, and/or a structural change, in that the target may be modified, damaged or even destroyed by ion-implantation. By way of example only, elements that are typically used for implanted species in semiconductor fabrication include boron, boron difluoride, arsenic, indium, gallium, thallium, germanium, bismuth, xenon, phosphorus and antimony. Boron is a p-type dopant in silicon because it donates or causes a "hole" (i.e., electron vacancy) in the silicon. Arsenic is an n-type dopant in silicon because it donates or causes an extra electron in the silicon. Dopants, such as boron and arsenic, implanted in intrinsic silicon, may cause the intrinsic silicon to become conductive as a semiconductor. One or more dopant materials may be implanted into a target material.

Ion-implantation is usually characterized by dose and energy. The dose is the number of ions that are implanted per area of target material. The energy is the energy of the ions being implanted. More advanced semiconductor processing or fabrication technologies typically use higher dose and/or higher energy than older technologies. In high dose ion-implantation (HDII), the ion dose may be greater than about $5 \times 10^{14}$ ions/cm$^2$ and/or the average energy of the ions, before the ions impact the target or substrate, may be from about five thousand electron volts (KeV) to greater than 100 KeV.

Resist including photoresist (more generally, masking material) is a radiation sensitive material that is used to form a patterned coating on a surface, for example, the surface of a substrate or target. Resists are used in the fabrication of semiconductor devices, for example, integrated circuits and silicon semiconductor devices. One use of resists in the fabrication of semiconductor devices is as a mask for selective ion-implantation of dopants into a semiconductor substrate. A layer of resist is applied to the surface of the semiconductor substrate, or to the surface of a layer on or within the substrate, such as an insulator layer above a semiconductor layer. A portion of the resist is exposed to the radiation, such portion of the resist corresponding to either the area of the semiconductor to be implanted (positive resist) or to the area of the semiconductor not to be implanted (negative resist). The resist is then exposed to a developer which assists in removing a portion of the resist so that only the desired portion of the resist remains. Positive resist is a type of resist in which the portion of the resist that is exposed to the radiation becomes soluble to, and removed by, the resist developer. The portion of the resist that is unexposed remains insoluble to, and is not removed by, the resist developer. Negative resist is a type of resist in which the portion of the resist that is exposed to the radiation becomes insoluble to, and not removed by, the photoresist developer. The portion of the resist that is not exposed to radiation remains soluble to, and is removed by, the resist developer. The soluble portion of resist is dissolved by the resist developer. Ion-implantation occurs after the resist is patterned by exposure to the radiation and developed by the developer. The remaining portion of the resist blocks the implanted ions from reaching the semiconductor, or other material, below the resist. The ions blocked by the resist are implanted into the resist instead of the underlying substrate. The portions of the semiconductor not covered by resist are ion-implanted.

The radiation to which various resists are sensitive encompasses a relatively broad range. By way of example only, the radiation may be within ultraviolet light (e.g., about 300 to 400 nm (nanometers)), deep ultra violet light (DUV; e.g., about 10 to 300 nm), G, H and I lines of mercury-vapor lamps (approximately 436 nm, 404.7 nm and 365.4 nm respectively), and x-rays (e.g., approximately 0.01 to 10 nm). The radiation may alternately comprise electron beam (e-beam) radiation. DUV light comprising a wavelength of approximately 193 nm and light comprising a wavelength of approximately 248 nm are often used for the radiation. The photolithographic technologies comprising radiations of approximately 193 and 248 nm are called 193 nm lithography and 248 nm lithography, respectively, Because of the relatively high dose and/or high energy of the implanted ions blocked by the resist, the resist forms a crust or hard shell on the outer portions or outer sides of the resist where the ions impact and are absorbed. The resist material that absorbs the ions is hardened by the ions. The ions that are absorbed by the resist are ions that are blocked by the resist from being implanted into the semiconductor or other material below the resist. The resist hardening may result from, or be referred to as, carbonization, polymerizing or polymer cross-linking. Specifically, the ions penetrating into the outer regions of the resist may cause the outer regions of the resist (e.g., top and sides of the resist) to become a crust, and chemical bonds in the inner regions of the resist close to the outer regions to become cross-linked. The crust is known to be difficult to remove during a resist stripping process (e.g., the crust is insoluble in some known solvents used for stripping). Because the ions only penetrate a limited distance into the resist material, the crust is formed mostly on the outer portions of the resist. Because the bottom of the resist is covered by the implanted material or substrate, the crust may form on the top and side surfaces of the resist, but not on the bottom portion or in the interior portion of the resist. For typical resist, the top crust is thicker than the side crust because the ions are usually implanted primarily with a downward direction of incidence. The thickness of the resist crust is dependent upon the dosage of the implanted ions and the ion-implant energy. The resist material that is inside or beneath the crust, that is, the portion of the resist that is generally unaffected by the ions, is referred to as bulk resist or bulk resist material. The hardening or crusting of the resist, for example, renders the outer portion of the resist insoluble, or less soluble, in water or in some other aqueous solutions (although, not necessarily in all other aqueous solutions or in all organic solvents).

Resist materials are often tailored for the wavelength of light, or the type of radiation, that they are meant to be exposed to. Such resist materials may be called with reference to the exposure wavelength, or to the type of radiation, for the resist material. For example, resist materials may be referred to as G-line, I-line, DUV (including 193 nm and 248 nm names), x-ray and e-beam.

High dose ion-implantation strip (HDIS) is the process of stripping exposed resist that has received HDII. Some HDIS processes may include dry processes, such as plasma processes and vacuum processes.

Characteristics of an HDIS process may include, for example, strip rate, amount of residue, and loss of the exposed and underlying layer, such as the substrate, silicon substrate or layers above silicon. Residues are sometimes found on the substrate surface after an HDIS. The residues may result from, for example, sputtering during HDII, incomplete removal of the outer layer of resist, and/or oxidation of implanted ions in the resist. Optimally, after stripping and, optionally, rinsing, the surface should be substantially residue free to ensure high yield and eliminate the need for additional residue removal processing. An example of additional residue removal processing is overstripping, such as a continuation of the strip process past the point nominally required to remove photoresist. Overstripping sometimes removes some of the underlying functional device structure which may adversely affect device performance and yield, especially for ultra shallow junction devices fabricated technologies at or below about 32 nanometers, and for metal gate transistor fabrication technologies.

A solution is a homogeneous mixture composed of two or more substances. In such a mixture, one or more solutes may be dissolved in a solvent. Solutions may comprise, for example, liquids dissolved in other liquids. Alternately, solutions may be solid solutions, for example, alloys. The ability of one compound to dissolve in another compound is called solubility. Physical properties of compounds may change when other compounds are added.

The meaning of metal gate or metal gate electrode, as used herein, includes gate electrodes of transistors (e.g., FET) comprising metal. The metal may be in combination with other material. One specific example of a metal gate comprises titanium nitride (TiN). It is noted that TiN has other uses in electronic devices, for example, as a barrier metal between silicon and metal contacts and as an electric conductor.

Ashing is an exemplary stripping process for resist that has not undergone HDII. Ashing involves heating the resist to a sufficiently high temperature to cause the resist to be removed through volatilization, usually while interacting with an oxidizing plasma. Ashing is a problematic method for stripping resist material that has been used as an ion-implantation mask, especially for HDII, because the resulting resist crust is resistant to the ashing process. As temperature increases, the pressure of the volatile bulk resist, underneath or inside of the crust, increases causing the bulk resist to breakthrough or "pop" through the resist crust. Such popping causes fragments of the resist crust to be spread over the surface of the wafer, strongly adhering to the wafer surface. Removal of resist crust fragments from the wafer surface may be difficult or impossible, causing, for example, severe yield degradation for devices being formed within a wafer substrate. Importantly, the removal of the resist crust should be performed at temperatures low enough to prevent popping. In general, using temperatures low enough to prevent popping may prolong the time required for resist removal, lowering wafer throughput (i.e., wafers processed per unit time). A problem called "bulk resist undercut" may occur when a thinner side crust is removed before a thicker top crust, causing the bulk resist to be removed beneath the upper crust, which is not completely removed at the time. Bulk resist undercut may cause pieces of top crust to break free and contact the substrate, strongly adhering to the substrate and, for example, reducing yield of devices formed within the substrate. Moreover, complete or substantially complete removal of resist, including resist crust, from the wafer is needed to enable acceptable yield of devices being formed in or on the substrate (e.g., a semiconductor or silicon wafer).

As outlined above, three important aspects of resist stripping are: (i) stripping at relatively low temperatures (e.g., low enough to prevent popping); (ii) relatively short times for resist stripping to allow for acceptable wafer throughput; and (iii) substantially complete removal of resist from the substrate surface. A fourth important aspect of resist stripping concerns damage to the substrate, or undesirable removal of a portion of the substrate, that may result from resist stripping. Such damage is undesirable, for example, because it may cause structures and devices formed in or on the substrate (e.g., transistors or other electronic devices formed in or on a semiconductor wafer or silicon wafer) not to function or to function poorly. Examples of damage to, or removal of, substrate material include, but are not limited to, damage to, or removal of, silicon or titanium nitride (TiN), for example, TiN comprised in a metal gate of an FET or TiN comprised in a barrier between a semiconductor and a metal. Silicon is comprised in silicon-on-insulator (SOI) wafers that may be used, for example, as substrates or part of a substrate for electronic devices such as FETs and integrated circuits. For example, "silicon" may be defined to include, Si, polycrystalline Si, monocrystalline Si, and SiGe. Other types of wafers may also comprise silicon. The damage, for example, may involve dissolution (etching), conversion to different solid phases such as oxides, or a combination of both. Other forms of "silicon" may include silicon-containing materials such as silicon oxide, thermal oxide, SiOH and SiCOH.

Embodiments of the invention, as will be described herein, are directed towards effective removal of post ion-implantation resist, which may be used, for example, as a block mask in silicon, other semiconductor technology and micro-electro-mechanical (MEM) technologies. Commonly known processes for resist removal involves either a combination of dry etching (e.g., plasma etch, vacuum processes) and wet etch (e.g., chemical etch), or a wet etch using sulfuric-acid-based chemistries, such as a mixture of sulfuric acid and hydrogen peroxide (SPM). A common drawback of many known resist strip methodologies currently used includes incomplete removal of crusted photoresist present on the wafer surface after ion-implantation. As semiconductor technologies advance, the advanced technology nodes require ion-implantation at higher dose and higher energy levels, increasing crusting of the ion-implantation blocking resist. In addition, resist removal via either dry etch or SPM immersion has been shown to produce excessive silicon and dopant loss and possible damage to fragile silicon structures.

Embodiments of the invention, as will be described herein, include methods for HDIS comprising, for example, temperatures lower than about 90 degrees centigrade (C.) (e.g., about 35 to 90 C, and/or low enough to prevent popping), reasonable times that are less than about 80 minutes to perform the HDIS (e.g., about 5 to 75 minutes), substantially complete removal of the resist (e.g., about 99% removal), and minimal or no damage to or removal of substrate material (e.g., less than approximately 50 angstroms removal of TiN, no or minimal silicon loss, and limited oxidation of components in a SOI wafer). HDIS according to methods of the invention may result in little or no remaining resist or resist crust residue, for example, either in solution or deposited on the wafer.

Embodiments of the invention, as will be described herein, use oxidation chemistry to react with ion-implanted resist to make the resist soluble in common solvents (e.g., water). The oxidation chemistry may include, for example, oxidation functional groups or chemical bonds. In particular, the crusted portion, or polymer containing portion, of the resist is made completely or substantially soluble.

Embodiments of the invention, as will be described herein, further provide stable aqueous solutions containing the lanthanoid element cerium, or a salt comprising cerium, which is capable of stripping high density ion-implanted resist.

Embodiments of the invention, as will be described herein, are useful for many technologies including, but not limited to, integrated circuit fabrication technologies commonly known as 32 or less nanometer technologies.

Embodiments of the invention, as will be described herein, may be used, for example, to form electronic devices, such as FETs, or to form source, drain and channel regions of FETs by blocking dopants (e.g., ion-implanted dopants) from entering other than the source, drain or channel region that is being implanted. Embodiments of the invention may be used, for example, to form conductors, by masking regions that are to be the conductors or are to be regions other than the conductors.

Figure 1:
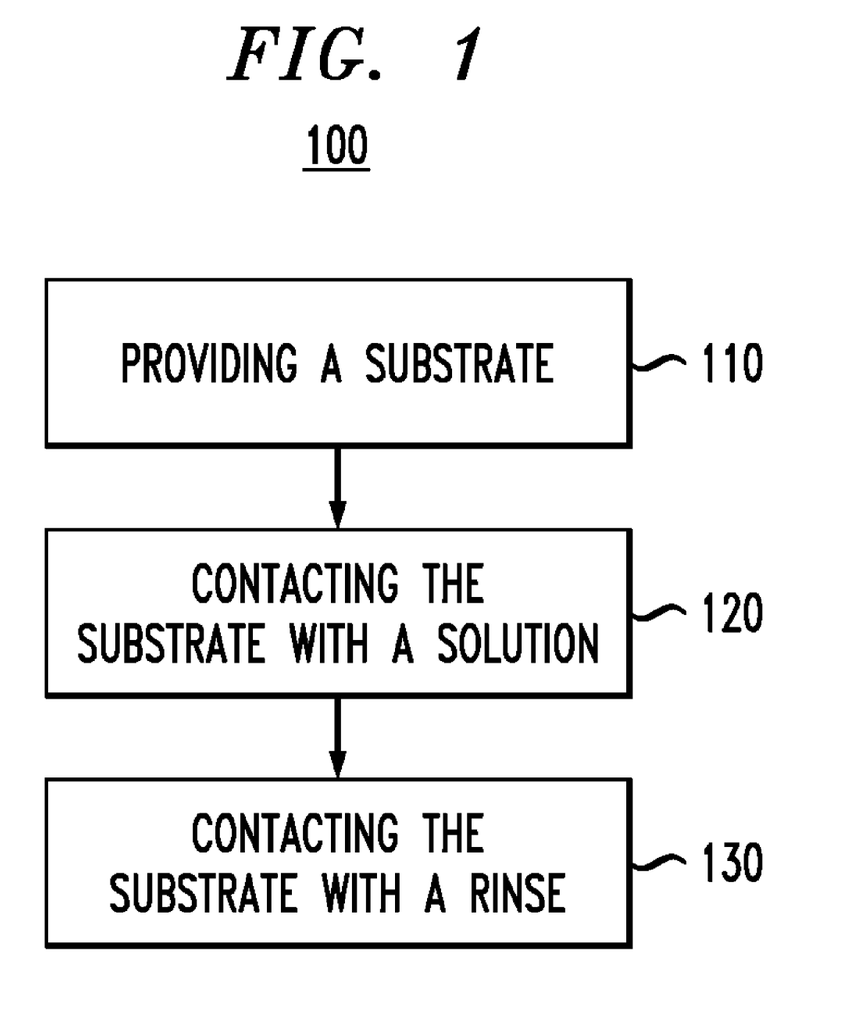
FIG. 1 shows a method for removing a masking material from a substrate according to an exemplary embodiment of the invention.

FIG. 1 generally shows a method 100 for the removal of a masking material from a substrate, according to an exemplary embodiment of the invention. The method may be a method of HDIS. Method 100 may, for example, involve wet chemistry without the use of plasmas or vacuum processes. Method 100 may be considered a wet-only method not involving dry processing (i.e., processing involving plasma or vacuum processes), although it should be appreciated by those skilled in the art that further dry processing, before or after wet processing, is contemplated.

Step 110 of method 100 comprises providing the substrate. The substrate may be a wafer, for example, a semiconductor wafer, upon or within which electronic devices are formed. The electronic devices may comprise transistors, such as FETs, including FETs comprising a metal gate (e.g., a metal gate comprising TiN). Some of the electronic devices may be partially formed when the wafer is provided, for example, ion-implantation of source/drain regions or a channel region may have been done prior to providing the wafer. By way of another example only, deposition of a TiN layer may have occurred prior to providing the wafer. The masking material may be adhered to the top surface of the wafer. The masking material may comprise a resist material, for example, a photoresist material. The masking material may have been ion-implanted (e.g., HDII) during ion-implantation of a portion of the wafer not covered by the masking material. The ion-implantation of the masking material may have caused a hardened, crusted, polymerized and/or carbonized outer layer to form in the masking material. The outer layer of the masking material may not be easily soluble, for example, not easily soluble in a rinse, such as rinses described below in step 130 and in Table 1.

Step 120 of method 100 comprises contacting the substrate, including the adhered masking material, with a solution. The solution comprises the lanthanoid element cerium. While cerium is the active element employed in the solution, it is to be understood that elements with the same or similar chemical characteristics as cerium could be used. Other lanthanoid elements may have some characteristics similar to cerium. Lanthanoid elements are generally known to be those elements with atomic numbers 57 through 71, i.e., lanthanum, cerium, praseodymium, neodymium, promethium, samarium, europium, gadolinium, terbium, dysprosium, holmium, erbium, thulium, ytterbium, and lutetium.

The solution may comprise at least one salt of the element cerium. The salt of cerium may be, for example, cerium ammonium nitrate. The chemical formula for cerium ammonium nitrate may be expressed as $Ce(NH_4)_2(NO_3)_6$ or $(NH_4)_2Ce(NO_3)_6$. Cerium ammonium nitrate is also known as CAN, cerium (IV) ammonium nitrate, eerie ammonium nitrate and ammonium cerium nitrate. CAN, as used herein, refers to cerium ammonium nitrate. CAN is an orange, water-soluble salt that may be used as an oxidizing agent. Other salts of cerium that may be used include, but are not limited to ceric nitrate, ceric ammonium sulfate, ceric sulfate, ceric bisulfate, ceric perchlorate, eerie methanesulfonate, ceric trifluoromethanesulfonate, ceric chloride, eerie hydroxide, and eerie acetate. In some embodiments of the invention, the solution may comprise more than one of the above salts of cerium. Preferably, the cerium salt comprises cerium ammonium nitrate.

The solution may further comprise an ammonium salt, for example, in addition to the ammonium compound in CAN. Addition of ammonium salts can also help stabilize the solution. Ammonium salts include, but are not limited to, at least one of ammonium chloride, ammonium nitrate, ammonium sulfate $(NH_4)_2SO_4$, ammonium bisulfate, ammonium acetate, ammonium perchlorate $(NH_4ClO_4)$, ammonium trifluoroacetate, ammonium methanesulfonate, and ammonium trifluoromethane sulfonate. For example, a solution comprising about 20% CAN and about 12% ammonium nitrate in water remains clear at 70 C for about 2.5 hours, compared with less than one hour for CAN alone. Ammonium chloride acts similarly. Other compounds that are stabilizing agents for formulations of CAN and water (e.g., DI water) include, but are not limited to, salts of weak bases and strong acids. For example, perchloric acid $(HClO_4)$, sulfuric acid $(H_2SO_4)$, glacial acetic acid $(CH_3COOH)$, and methanesulfonic acid $(CH_3SO_3H)$ may be used as stabilizing agents. One or more stabilizing agents may be used. The effective range of concentrations for these stabilizers is from about 0.5% to about 25% by weight, based on the total weight of the solution. By way of example only, 5% ammonium chloride has provided stability for formulations comprising CAN and water without adverse effect on HDIS and on TiN compatibility.

The solution may further comprise other solutes or solvents. For example, the solution may further comprise water ($H_2O$) as a solvent, such as deionized water (DI water). Embodiments include about 1 wt % to about 40 wt % cerium salt and about 60 wt % to about 99 wt % DI water, preferably about 5 wt % to about 35 wt % cerium salt and about 65 wt % to about 95 wt % DI water, even more preferably about 10 wt % to about 30 wt % cerium salt and about 70 wt % to about 90 wt % DI water, and most preferably about 15 wt % to about 25 wt % cerium salt and about 75 wt % to about 85 wt % DI water, based on the total weight of the solution. An exemplary formulation of the solution comprises approximately 20% by weight CAN and about 80% by weight DI water. Alternate formulations are contemplated, for example, formulations comprising CAN and aqueous acidic solutions.

Since ceric solutions in water tend to hydrolyze and generate precipitates over time, especially when kept above ambient temperature (i.e., above about 20 to 25 C). Addition of acid or other compounds as stabilizing agents may be employed in order to stabilize the solution. Ceric salts in water are generally stable, but at elevated temperatures around 70 C, ceric salts generate precipitates due to hydrolysis and/or redox reactions. However, in strongly acidic solutions such precipitates are soluble. For this reason, CAN may be formulated in acidic media in order to stabilize the solution and prevent or limit precipitation of the cerium.

The stabilizing agents act to reduce precipitation, for example, by dissolving precipitant from the solution (e.g., precipitation or precipitant of CAN or one or more of the components of CAN). For example, a 20% CAN solution in water may generate large amounts of precipitate and becomes completely opaque after about 30-45 minutes, which is a relatively short period of time, at about 70 C. At the same CAN concentration and temperature, when the solvent comprises about 5.5% nitric acid and about 74.5% water, there is virtually no precipitate even after 24 hours. Acids contemplated include, but are not limited to, one or more of nitric acid, hydrochloric acid, sulfuric acid, perchloric acid, glacial acetic acid, methanesulfonic acid, trifluoromethanesulfonic acid, and polysulfonic acid (e.g., poly(4-styrenesulfonic acid). Alternatively, or in addition to, other water soluble polymers may be added including, but not limited to, polyacrylic acid, polymethacrylic acid, and polymeric acid. Example of polymeric acid include, but are not limited to, polymaleic acid, polytetraflourosulfonic acid, poly(ethylene-maleic) acid and polystyrene carboxylic acid. The effective range of concentrations for these stabilizers is from about 0.5% to about 60% by weight, based on the total weight of the solution.

Embodiments of the solution of the invention include, but are not limited to, (i) a solution comprising, consisting of, or consisting essentially of, cerium salt and solvent, (ii) a solution comprising, consisting of, or consisting essentially of, cerium salt, solvent, and ammonium salt, (i) a solution comprising, consisting of, or consisting essentially of, cerium salt, solvent and acid, or (iv) a solution comprising, consisting of, or consisting essentially of, cerium salt, solvent, ammonium salt and acid.

The substrate may contact the solution by immersion of the substrate in the solution. Other methods of contact are also contemplated, for example, spraying, rinsing or washing the substrate with the solution, and agitating the substrate in the solution. The substrate is typically contacted with the solution for a specific time duration. Time durations between about 5 and about 60 minutes are examples of effective time durations for the contacting the substrate with the solution.

The solution and/or the substrate may be heated to and/or maintained at a specific temperature or within a specific temperature range. Temperatures low enough to prevent popping of the masking material are preferred. Other considerations may also dictate an upper limit on the temperature range, for example, the boiling point of water. Temperatures between about 35 and 90 C are examples of effective temperatures for the solution for the performance of step 120.

The solution may remove at least a portion, if not substantially all, of the masking material. In the best case, the solution may remove all (100%) of the masking material. Contact of the substrate and the adhered masking material to the solution may change one or more characteristics of the masking material. Contact of the substrate and the adhered masking material to the solution may make the masking material, especially the outer portion or the crust of the masking material, soluble, or more soluble than before contact with the solution. For example, the masking material may be made soluble, or more soluble, to the liquid or rinses of step 130 and Table 1 (see below). Consequently, the rinse described in step 130 may remove all or some of the remaining portion of the masking material by dissolving the masking material. The rinse may additionally or alternately mechanically remove (e.g., flush, rinse or wash off) masking material.

Step 130 of method 100 is contacting the substrate, and any remaining masking material adhered to the substrate, with a rinse. In one embodiment of the invention, step 130 occurs after step 120. The rinse removes some or all of the remaining masking material from the surface of the substrate. In a preferred embodiment, the rinse removes substantially all of the remaining masking material, or at least enough of the remaining masking material to allow reasonable or desired yield of electronic devices that are being formed in or upon the substrate. The remaining masking material may comprise all or a portion of the outer layer and/or all or a portion of the bulk material. All or a portion of the outer layer may have been previously made soluble to the rinse by step 120.

The substrate may contact the rinse by immersion of the substrate in the rinse. Other methods of contact are also contemplated, for example, spraying or washing the substrate with the rinse and agitating the substrate in the rinse. The substrate is typically contacted with the rinse for a specific time duration. Exemplary time durations will be shown in later experimental descriptions of the method.

The rinse and/or the substrate may be heated to and/or maintained at a specific temperature or within a specific temperature range. Temperatures between approximately 55 and approximately 90 C are effective.

The rinse may comprise, for example, sulfuric acid ($H_2SO_4$) or sulfuric acid and water (e.g., DI water). The rinse may comprise a single rinsing or a sequence of rinsing procedures. For example, the rinse may comprise a single rinsing in water, sulfuric acid or sulfuric acid and water. An example of a sequence of rinsing procedures is an initial rinse in water followed by a rinse in sulfuric acid or sulfuric acid and water, and, optionally followed by another rinse in water. Additional rinses are contemplated. Drying may occur between rinses, after the final rinse, and between contacting the solution and the initial rinse. Drying may take place in an atmosphere comprising nitrogen ($N_2$).

In an embodiment of the invention, steps 120 and 130 are sufficient to remove all, nearly all, or substantially all (e.g., about 100%) of the masking material. Steps involving plasma, plasma etching or vacuum processes are not required, although may be used when preferred, as readily determinable by one skilled in the art.

Method 100 may be considered as a method for forming or fabricating, at least in part, an electronic device, for example an FET, an integrated circuit or a MEM, for example a micro-electro-mechanical system (MEMS). By way of example only, an electronic device may be formed by forming a substrate (e.g., a substrate comprises titanium nitride), ion-implanting (e.g., HDII) photoresist, and contacting the photoresist with a solution comprising cerium (e.g., CAN).

A MEM or a MEMS is a device fabricated with the integration of mechanical element (e.g., switches, sensors or actuators) and electronics (e.g., transistors, inductors, resistors, electronic memory elements, capacitors, and electronic conductors) on a common substrate (e.g., a substrate comprising silicon and/or TiN) through micro-fabrication technology. The micro-mechanical components are fabricated, for example, using micro-machining processes that selectively etch away parts of the silicon wafer or add new structural layers. A MEM is commonly fabricated on silicon substrates using processes compatible with complimentary-metal-oxide-semiconductor (CMOS) IC technology. Fabrication of a MEM may comprise resist removal according to embodiments of the present invention.

Method 100 and other methods of the invention may comprise, for example, reduction of water or acid soluble cerium (IV) compounds to cerium (III) compounds that sometimes are water insoluble.

Control of the acidity or the pH of the solution controls the solubility of cerium salts that are in mixture or solution. The acidity or the pH may be controlled, for example, by the amount of acid in an aqueous acid solution (i.e., a solution comprising acid and water as well as the cerium), such as the solutions of Examples 2 and 3 below.

Principles of the invention are more fully illustrated by the following non-limiting examples. In the examples, percentages are by weights. Table 1 illustrates four examples of implementation of method 100. All examples are for the removal of resist (i.e., masking material) from a substrate to which the resist is adhered. The resist is implanted with arsenic ions at the indicated dose and energy. Step 110 of method 100 comprises providing the above described substrate with adhered resist.

TABLE 1

|  | Example 1 | Example 2 | Example 3 | Example 4 |
|---|---|---|---|---|
| Implant dose (/cm$^2$) | $1 \times 10^{16}$ | $3.5 \times 10^{15}$ | $1 \times 10^{16}$ | $1 \times 10^{16}$ |
| Implant energy (KeV) | 25 | 25 | 25 | 25 |
| Solution | 20% CAN 80% solvent | 15% CAN 85% solvent | 20% CAN 80% solvent | 55% CAN 45% solvent |
| Solvent | Water | 10% concentrated HClO$_4$ 90% water | 50% CH$_3$COOH 50% water | Water |
| Temperature (deg. C.) | 70 | 60 | 70 | 80 |
| Time (minutes) | 30 | 30 | 60 | 15 |
| First rinse procedure (seconds in water) | 30 | 30 | 30 | 30 |
| Second rinse procedure | none | 96.5% H$_2$SO$_4$ 15 min. at 19 C. | 96.5% H$_2$SO$_4$ 15 min. at 19 C. | none |
| Third rinse procedure | none | Running water | Running water | none |

All doses, energies, solution compositions, solute compositions, temperatures and times given in Table 1 are approximate.

It is important to note that principles of the invention are not limited to any exact measurement values or ranges. Thus, measurement values and ranges given herein are intended to be illustratively instructive as to how to form the inventive solution and apply same without requiring any undue experimentation on the part of one having ordinary skill in the art. Thus, measurement values and ranges other than those illustratively provided herein are contemplated as being within the scope of the invention.

In example 1, the solution of method 100 comprises approximately 20% CAN and approximately 80% DI water. The substrate is immersed in (i.e., contacts) the solution for approximately 30 minutes after the solution has been heated to approximately 70 C. This immersion in the solution is comprised in step 120 of method 100.

The substrate is removed from the solution, rinsed by immersion for approximately 30 seconds in DI water, and dried in a nitrogen (N$_2$) containing atmosphere. This rinse is comprised in step 130 of method 100.

In example 2, the solution of method 100 comprises approximately 15% CAN and approximately 85% solvent. The solvent comprises approximately 10% of concentrated perchloric acid (HClO$_4$) in DI water (i.e., about 10% concentrated perchloric acid and about 90% water). Concentrated perchloric acid comprises about 70% perchloric acid and, for example, about 30% water. The substrate is immersed in the solution for about 30 minutes after the solution has been heated to approximately 60 C. This immersion in the solution is comprised in step 120 of method 100.

The substrate is removed from the solution and undergoes a first rinsing procedure by immersion for about 30 seconds in DI water. The substrate is then dried in a nitrogen containing atmosphere. The substrate then undergoes a second rinsing procedure comprising immersion in concentrated sulfuric acid (i.e., about 96.5% sulfuric acid and about 3.5% DI water) for approximately 15 minutes after the sulfuric acid solution has been adjusted to a temperature of approximately 19 C. The substrate then undergoes a third rinsing procedure comprising a brief rinse in running DI water. By way of example only, the running water may be at or near room temperature and the duration of the third rinsing procedure may be about 1 minute or less. The substrate is then dried in a nitrogen containing atmosphere. This rinse, including the first, second and third rinsing procedures, is comprised in step 130 of method 100.

In example 3, the solution of method 100 comprises approximately 20% CAN and approximately 80% solvent. The solvent comprises approximately 50% glacial acetic acid (CH$_3$COOH), in DI water (i.e., about 50% glacial acetic acid and about 50% DI water). The substrate is immersed in the solution for approximately 60 minutes after the solution has been heated to approximately 70 C. This immersion in the solution is comprised in step 120 of method 100.

The substrate is removed from the solution and undergoes a first rinsing procedure by immersion for about 30 seconds in DI water. The substrate is then dried in a nitrogen containing atmosphere. The substrate then undergoes a second rinsing procedure comprising immersion in concentrated sulfuric acid (i.e., about 96.5% sulfuric acid and about 3.5% DI water) for approximately 15 minutes after the sulfuric acid solution has been adjusted to a temperature of approximately 19 C. The substrate then undergoes a third rinsing procedure comprising a brief rinse in running DI water. By way of example only, the running water may be at or near room temperature and the duration of the third rinsing procedure may be about 1 minute or less. The substrate is then dried in a nitrogen containing atmosphere. This rinse, including the first, second and third rinsing procedures, comprises step 130 of method 100.

In example 4, the solution of method 100 comprises approximately 55% CAN and approximately 45% DI water. The substrate is immersed in the solution for approximately 15 minutes after the solution has been heated to approximately 80 C. This immersion in the solution is comprised in step 120 of method 100.

The substrate is removed from the solution, rinsed by immersion for about 30 seconds in DI water, and dried in a nitrogen containing atmosphere. This rinse is comprised in step 130 of method 100.

Solution formulations that may be effective include, but are not limited to, solutions comprising about 2% to about 70% CAN and a solvent. Effective examples of solvents include, but are not limited to, solvent compositions comprising about 1% to about 55% concentrated perchloric acid, about 5% to about 60% acetic acid, about 1% to about 50% nitric acid ($HNO_3$), about 1% to about 50% sulfuric acid, about 1% to about 50% methanesulfonic acid ($CH_3SO_3H$), about 1% to about 55% trifluoromethanesulfonic acid ($CF3SO3H$), and/or about 1% to about 55% polysulfonic acid (e.g., polystyrenesulfonic acid). It is contemplated that the solutions may comprise only one or more than one acid. By way of example only, a substrate may be immersed in an aqueous solution of about ten to about seventy-five percent polysulfonic acid. The concentration of the polysulfonic acid used may be from about ten to about fifty percent concentrated polysulfonic acid in water. The polysulfonic acid may be, for example, polystyrenesulfonic acid.

Methods of the invention are useful for stripping resist that has been implanted with HDII, for example, implanted with about $5 \times 10^{14}$ or more ions/cm$^2$ and/or at energies above about 5 KeV. However, methods of the invention are not so limited and may be useful for stripping resist that has been implanted with fewer than $5 \times 10^{14}$ ions/cm$^2$ and at energies below 5 KeV. Methods of the invention may be useful for stripping resists that are patterned by procedures including exposed to one of the following types of radiation: e-beam, x-rays, and light of wavelengths corresponding to G-line, H-line, I-line DUV, about 248 nm and about 193 nm.

An experiment was performed to measure the effect of CAN chemistry on TiN. TiN was chosen because TiN is comprised in metal gates of some FETs, for example, FETs formed, in part, using illustrative methods of the invention. The experiment comprised exposing TiN deposited upon a wafer to a 20% aqueous solution of CAN for varying times at two temperatures and measuring the thickness of a titanium oxide ($TiO_x$) layer formed from titanium formerly within the TiN layer before the wafer and TiN were exposed to the CAN. The thicknesses of the remaining TiN layer and the remaining SiOxide layer were also measured (i.e., thicknesses remaining after immersion in CAN).

TABLE 2

| Wafer | Temp. (° C.) | Time (min.) | $TiO_x$/TiN/SiOxide (angstroms) |
|---|---|---|---|
| Control | 85 | 0 | 4/110/~2000 |
| 1 | 85 | 30 | 12/100/~2000 |
| 2 | 85 | 60 | 35/80/~2000 |
| 3 | 65 | 10 | 12/95/~2000 |
| 4 | 65 | 15 | 27/95/~2000 |
| 5 | 65 | 30 | 37/85/~2000 |

Table 2 above shows experimental results illustrating the advantageous compatibility of CAN, used as a HDIS, with TiN. The experimental results were obtained by application of method 100. In this case, step 110 comprised providing a silicon wafer coated with approximately (~) 2000 angstroms of silicon oxide (SiOxide) and a nominally (approximately) 130 angstrom layer of TiN over the layer of SiOxide. The provided wafer as coated is called the original wafer. All temperatures, times and dimensions given in Table 2 are approximate.

Step 120 comprised immersion of the wafer in a solution of approximately 20% CAN and approximately 80% DI water for the times and temperatures indicated in the table. Step 130 comprised rinsing the wafer in DI water after the immersion in the solution and drying in an atmosphere comprising nitrogen. Subsequent to immersing in CAN, rinsing and drying, the thicknesses of the remaining layers were measured by reflectometry. As shown in the table, the remaining layers comprise an upper layer of $TiO_x$, a TiN layer that is a remaining portion of the original TiN layer before immersion in CAN, and the SiOxide layer that is substantially the original SiOxide layer before immersion in CAN. A control wafer was not immersed in CAN. For the control wafer, an approximately 4 angstrom thick $TiO_x$ layer was measured and an approximately 110 angstrom thick TiN layer was measured. The measured approximately 4 angstroms thick $TiO_x$ layer and the measured apparent decrease from approximately 130 to approximately 110 angstroms in thickness (i.e., an approximately 20 angstrom thickness difference) of the TiN layer are not due to CAN, but have other causes, for example, oxidation of TiN not due to CAN or experimental error. Whatever the cause, in calculating the effects of CAN upon TiN, it is reasonable to subtract the control wafer measured approximately 4 angstroms $TiO_x$ layer thickness from the measured thickness of $TiO_x$ layers resulting from immersion in CAN. Likewise, it is reasonable to subtract the approximately 20 angstrom TiN layer thickness difference from the TiN layer differences of the wafers immersed in CAN and the original wafer.

For example, the table shows that for wafer 2, immersed in CAN at approximately 85 C for about 60 minutes, the TiN layer is reduced form a control wafer thickness of about 110 angstroms to about 80 angstroms and a TiOx layer has formed that is about 35 angstroms thick, that is, about 31 angstroms thicker than for the control wafer. Thicknesses of TiN layers and $TiO_x$ layers, as shown in the table, are acceptable for an HDIS strip and for device fabrication. It is important to note that if TiN specimens identical to the ones used here would be immersed in a common wet resist strip mixture (i.e., a hot solution containing sulfuric acid and hydrogen peroxide), the entire TiN layer would be etched away in less than one minute. That is certainly not the case for the formulations disclosed in the present invention.

Figure 2:
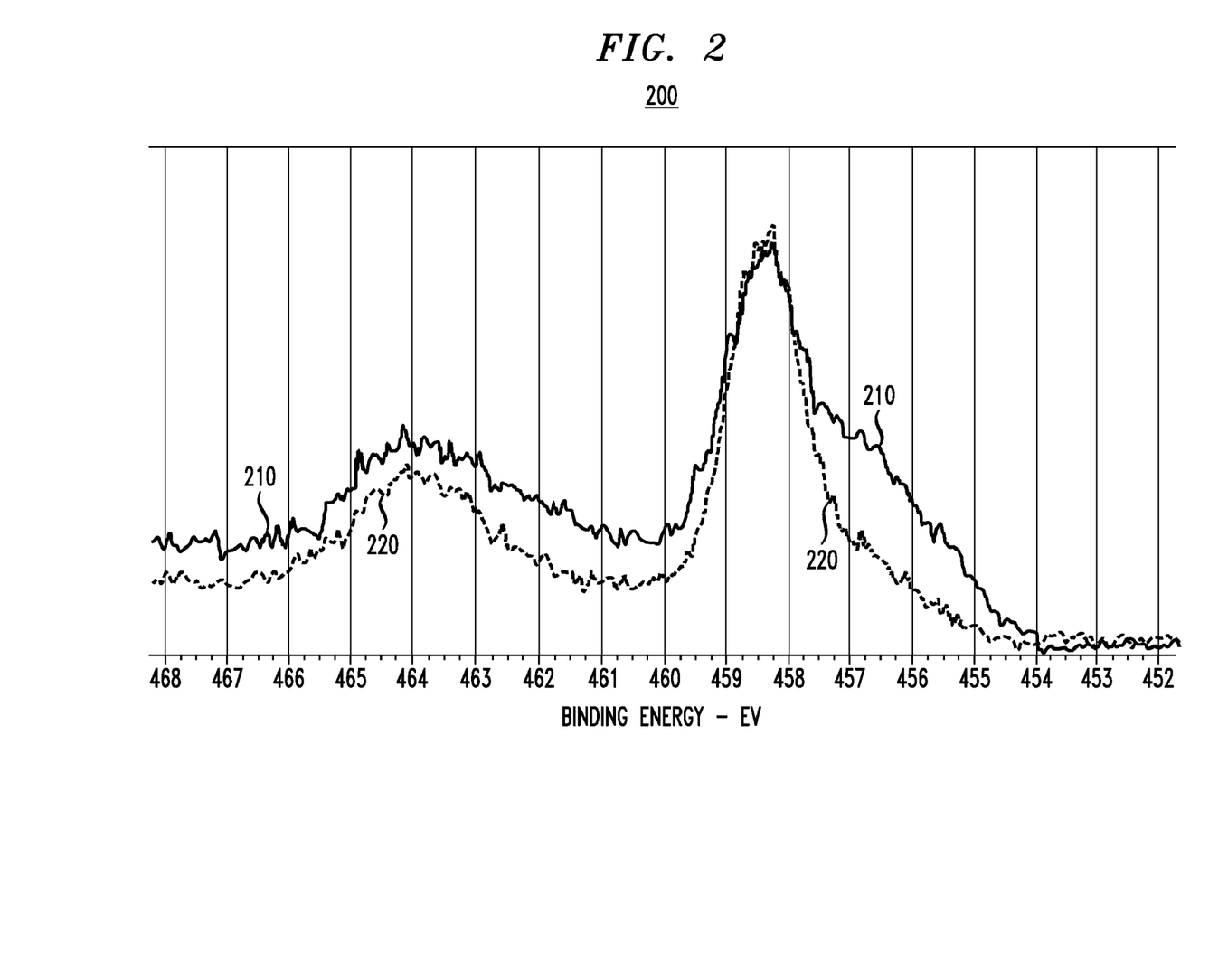
FIG. 2 shows results of an x-ray photoelectron spectroscopy (XPS) analysis of a wafer that has been processed using a masking material removal method according to an exemplary embodiment of the invention.

FIG. 2 shows the results of an x-ray photoelectron spectroscopy (XPS) analysis of the control wafer and wafer 5 of Table 2. Trace 210 represents the control, that is, the wafer prior to immersion in the CAN solution. Trace 220 represents wafer 5 after immersion. The peak centered between binding energies of about 458 and 449 electron volts (EV) corresponds to oxidized titanium, most likely in the form of titanium oxide. The peak that appears as a shoulder centered between binding energies of about 456 and 457 electron-volts corresponds to titanium nitride. From the XPS data the $TiO_x$ thickness can be qualitatively estimated to no less than about 20 to 30 angstroms. This result from the XPS analysis is in good agreement with the experimental results measured with reflectometry and presented in Table 2. It is important to note that the shoulder centered between 456 and 457 EV is also detectable in trace 220, suggesting that post processing via Method 100, TiN is still present under the top TiOx layer.

Table 3 below shows the effect of processing with a solution comprising CAN on samples of a silicon wafer, a portion of a silicon-on-insulator (SOI) wafer, a portion of a wafer coated with a 193 nm sensitive resist, and TiN. All temperatures and times given in Table 3 are approximate.

The samples were processed by immersion in a solution of approximately 20% CAN and approximately 80% DI water for the indicated times and at the indicated temperatures. For the silicon wafer sample and the 193 resist sample immersion in the CAN solution was followed by a sulfuric rinse for about 5 minutes at or near room temperature (RT). Analysis of the samples after immersion and rinsing (if any) was by XPS, and for the silicon wafer sample, additionally by total reflection x-ray fluorescence analysis (TXRF). Cerium was not detected in the post-processed samples, except for the sample of TiN. Regarding the sample of TiN, the cerium was removed after a second part of a resist strip procedure consisting of immersion in cold sulfuric acid for about 5 to 15 minutes.

TABLE 3

| Sample | Process | Analysis Method | Was Cerium Detected? |
|---|---|---|---|
| Si wafer | CAN: 65 C., 60 min. | TXRF | No |
| | $H_2SO_4$ rinse: 5 min, RT. | XPS | No |
| SOI wafer portion | CAN: 65 C., 30 min. | XPS | No |
| 193 resist | CAN: 65 C., 30 min. | XPS | No |
| | $H_2SO_4$ rinse: 5 min, RT. | | |
| TiN | CAN: 65 C., 30 min. | XPS | Yes |

Figure 3:
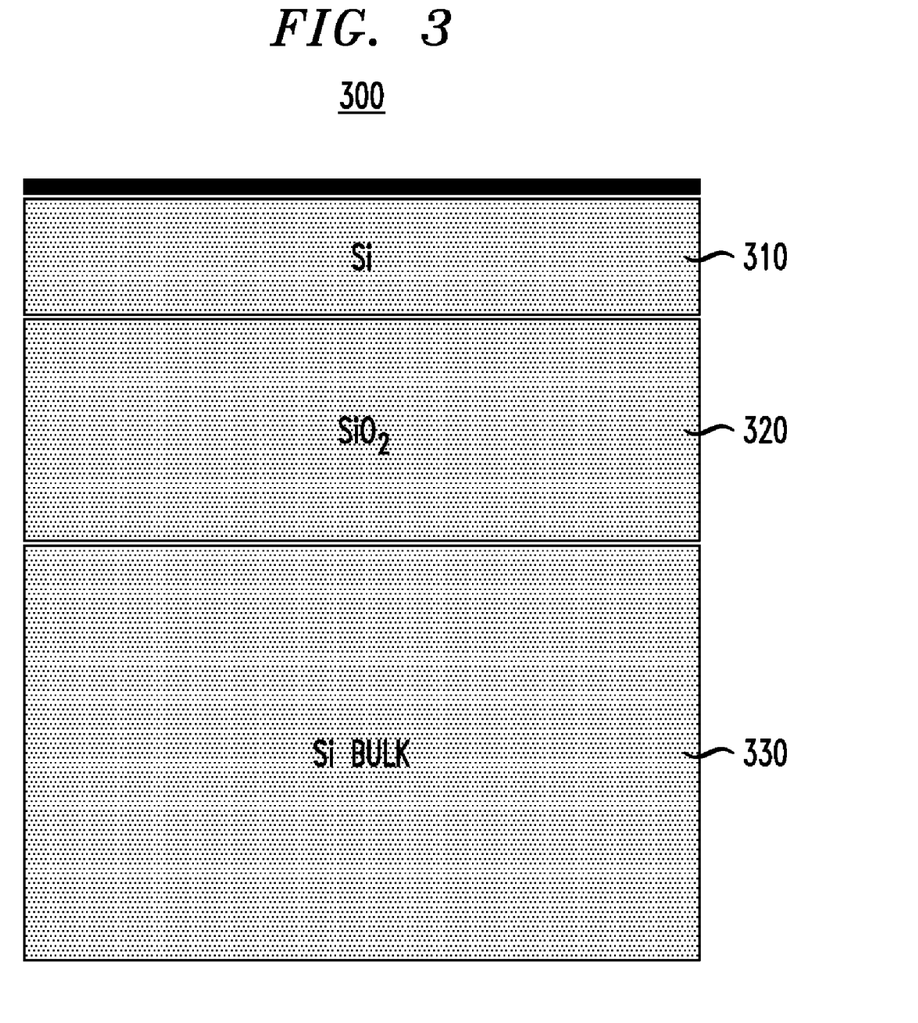
FIG. 3 is a scanning electron microscope (SEM) image of a cross section of a silicon-on-insulator (SOI) wafer that has been processed using a masking material removal method according to an exemplary embodiment of the invention.

FIG. 3 is a scanning electron microscope (SEM) image with white lines drawn to highlight borders between layers of a cross section of a SOI wafer 300 after the wafer has been immersed in a solution of approximately 20% CAN and approximately 80% DI water for about 30 minutes at approximately 65 C. The SOI wafer comprises a bulk silicon substrate 330, an insulating layer of silicon dioxide ($SiO_2$) 320 abutting the bulk silicon substrate 330, and an upper silicon layer 310 abutting the insulating layer 320. Prior to immersion, the thickness of the upper silicon layer 310 was nominally (approximately) 70 nm. After immersion the thickness of the upper silicon layer 310 measured by the SEM is approximately 69.22 nm. Therefore, there is no measurable thinning of the SOI wafer, or of the layers comprised within the SOI wafer, after immersion in the CAN solution.

Figure 4:
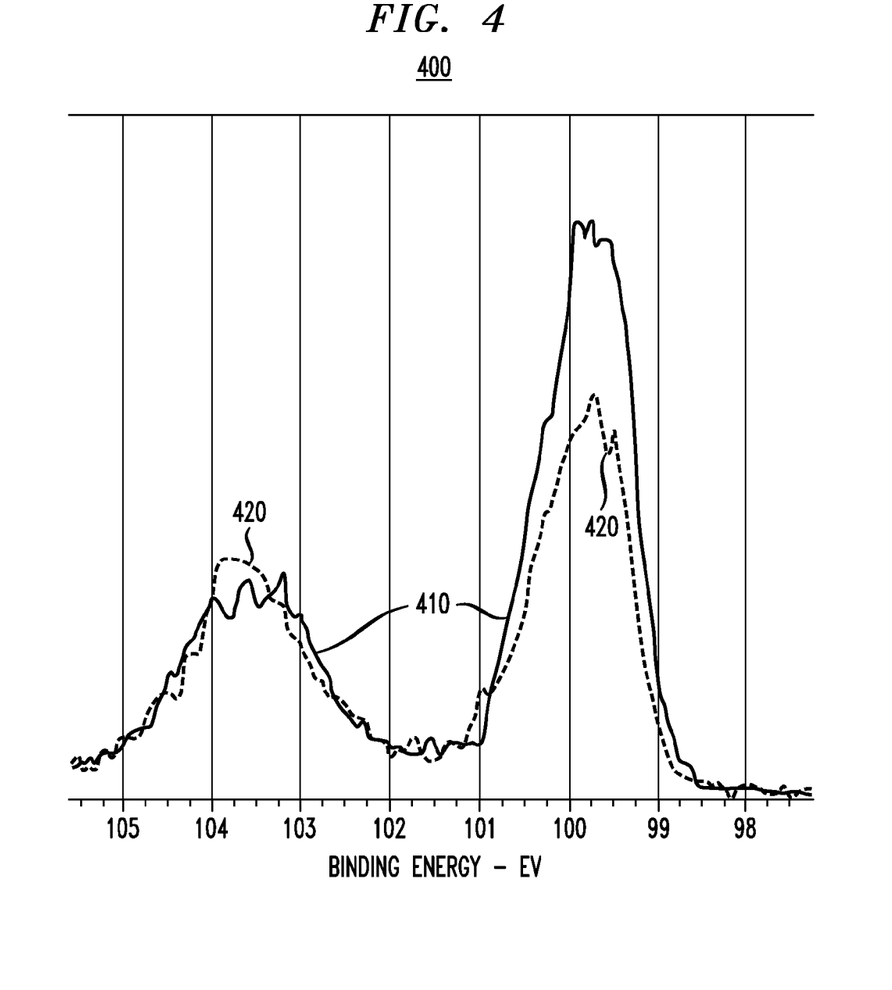
FIG. 4 shows results of an XPS analysis of a silicon-on-insulator wafer that has been processed using a masking material removal method according to an exemplary embodiment of the invention.

FIG. 4 shows the results of an XPS analysis of the SOI wafer 300 after the wafer has been immersed in the CAN solution as described with reference to FIG. 3. The leftmost peak, having binding energy between about 103 and 104 electron volts (EV), corresponds to $SiO_2$. The rightmost peak, having binding energy between about 99 and 101 electron volts, corresponds to Si. Trace 410 represents the control, that is, the wafer prior to immersion in the CAN solution. Trace 420 represents the wafer after immersion.

At least a portion of the techniques of the present invention, for example, the techniques illustrated in FIGS. 1-4, may be implemented in one or more integrated circuits. In forming integrated circuits, die are typically fabricated in a repeated pattern on a surface of a semiconductor wafer. Individual die are cut or diced from the wafer, then packaged as integrated circuits. One skilled in the art would know how to dice wafers and package die to produce integrated circuits. Integrated circuits so manufactured are considered part of this invention.

Figure 5:
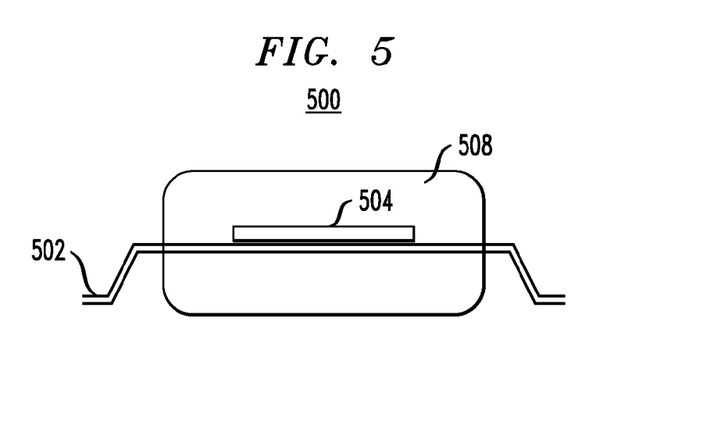
FIG. 5 shows a cross-sectional view of a packaged integrated circuit that has been processed using a masking material removal method according to an exemplary embodiment of the invention.

FIG. 5 is a cross-sectional view depicting a packaged integrated circuit 500 according to an embodiment of the present invention. The packaged integrated circuit 500 comprises a leadframe 502, a die 504 attached to the leadframe, and a plastic encapsulation mold 508. Although FIG. 5 shows only one type of integrated circuit package, the invention is not so limited; the invention may comprise an integrated circuit die enclosed in any package type.

The die 504 includes a device described herein, for example, an FET or other electronic device formed according to methods of the invention, and may include other structures or circuits. For example, the die 504 may include at least one conductor, MEM device, FET, source, drain or channel region of an FET, or gate conductor of an FET, the formation of which comprises the removal of resist by methods of the invention.

It is to be appreciated that the integrated circuits and integrated circuit assemblies formed in accordance with the present invention described herein and shown in the figures may be employed in applications, hardware and/or electronic systems, e.g., one or more digital computers with associated memory, implementation-specific integrated circuit(s), functional circuitry, etc. Other suitable hardware and systems for comprising or using components of the invention may include, but are not limited to, personal computers, communication networks, electronic commerce systems, portable communications devices (e.g., cell phones), and solid-state media storage devices. Systems and hardware incorporating such integrated circuits are considered part of this invention. Given the teachings of the invention provided herein, one of ordinary skill in the art will be able to contemplate other implementations and applications of the techniques of the invention.

It is noted that embodiments of the invention are also applicable for removal and stripping of photoresists that are not ion implanted, or at least not heavily ion implanted. Such photoresists include photoresists that may not be soluble in conventional organic solvents, for example, negative photoresist that due to polymer cross-linking are not soluble in conventional organic solvents. Such photoresists may be remove or stripped using techniques of the present invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for removing resist, the method comprising: contacting resist with a solution comprising cerium, wherein the resist is comprised within a layer formed on at least a first portion of a substrate, and wherein the resist blocks at least a first portion of dopant material from contacting the at least a first portion of the substrate, wherein at least a portion of the resist is at least one of: hardened by absorption of the first portion of the dopant material; and made less soluble by absorption of the first portion of the dopant material.

2. The method of claim 1, wherein the cerium is comprised in a salt.

3. The method of claim 2, wherein the salt is cerium ammonium nitrate, $Ce(NH_4)_2(NO_3)_6$.

4. The method of claim 2, wherein the salt is at least one of: ceric nitrate; ceric ammonium sulfate; ceric sulfate; ceric bisulfate; ceric perchlorate; ceric methanesulfonate; ceric trifluoromethanesulfonate; ceric chloride; ceric hydroxide; and ceric acetate.

5. The method of claim 1, wherein the solution further comprises at least one ammonium salt, selected from the group consisting of: ammonium chloride; ammonium nitrate; ammonium sulfate; ammonium bisulfate; ammonium acetate; ammonium perchlorate; ammonium trifluoroacetate; ammonium methanesulfonate; and ammonium trifluoromethane sulfonate.

6. The method of claim 1, wherein the solution further comprises water ($H_2O$).

7. The method of claim 1, wherein the solution comprises from approximately two to approximately seventy percent by weight cerium ammonium nitrate, based on the total weight of the solution.

8. The method of claim 1, wherein the solution further comprises at least one acid selected from the group consisting of: perchloric acid; acetic acid; nitric acid; sulfuric acid; methanesulfonic acid; trifluoromethanesulfonic acid; hydrochloric acid; and polystyrenesulfonic acid.

9. The method of claim 8, wherein the solution comprises at least one of: from approximately one to approximately fifty-five percent by weight concentrated perchloric acid; from approximately five to approximately sixty percent by weight acetic acid; from approximately one to approximately fifty percent by weight nitric acid; from approximately one to approximately fifty percent by weight sulfuric acid; from approximately one to approximately fifty percent by weight methanesulfonic acid; from approximately one to approximately fifty-five percent by weight trifluoromethanesulfonic acid; and from approximately one to approximately fifty-five percent by weight polystyrenesulfonic acid, based on the total weight of the solution.

10. The method of claim 1, wherein a temperature of the solution, when the solution is contacting the resist, is between approximately thirty-five and approximately ninety degrees Centigrade.

11. The method of claim 1, wherein the first portion of the dopant material comprises ions implanted into the resist.

12. The method of claim 11, wherein the ions implanted into the resist comprise at least one of: boron; boron trifluoride; indium; gallium; thallium; germanium; bismuth; arsenic; phosphorus; xenon and antimony.

13. The method of claim 11, wherein at least one of: (i) a number of the ions implanted per square centimeter averages greater than approximately $5 \times 10^{14}$; and (ii) an average energy of the ions implanted before the ions impact the resist is greater than approximately 5 thousand electron volts.

14. The method of claim 1, wherein a second portion of the dopant material comprises ions implanted into a second portion of the substrate.

15. The method of claim 1, wherein the resist comprises a resist exposed to at least one of: (i) light comprising one or more wavelengths between approximately 10 and approximately 400 nanometers; (ii) x-ray radiation, and (iii) electron beam radiation.

16. The method of claim 1, wherein at least a first portion of the resist is removed by the solution, and the method further comprising: contacting the resist with a liquid to remove a second portion of the resist.

17. The method of claim 16, wherein at least one of: the liquid dissolves at least part of the second portion of the resist, and the liquid flushes off at least part of the second portion of the resist.

18. The method of claim 16, wherein the liquid comprises at least one of: water; an acid; and sulfuric acid ($H_2SO_4$).

19. The method of claim 16, wherein the contacting of the resist with the solution and the contacting of the resist with the liquid removes substantially all of the resist.

20. The method of claim 1, wherein the solution further comprises at least one of: nitric acid; an ammonium salt; ammonium nitrate; ammonium chloride; ammonium sulfate; ammonium perchlorate; ammonium trifluoroacetate; ammonium methane sulfonate; ammonium trifluoromethane sulfonate; a salt of weak bases and strong acids; perchloric acid; sulfuric acid; glacial acetic acid; and methanesulfonic acid.

21. An electronic device formed by removing resist by contacting the resist with a solution comprising cerium, wherein the resist is comprised within a layer formed on at least a first portion of a substrate, and wherein the resist blocks at least a first portion of dopant material from contacting the at least a first portion of the substrate, wherein at least a portion of the resist is at least one of: hardened by absorption of the first portion of the dopant material; and made less soluble by absorption of the first portion of the dopant material.

22. The electronic device of claim 21, wherein the cerium is comprised in a salt.

23. The electronic device of claim 22, wherein the salt is cerium ammonium nitrate, $Ce(NH_4)_2(NO_3)_6$.

24. The electronic device of claim 22, wherein the salt is at least one of: ceric nitrate; ceric ammonium sulfate; ceric sulfate; ceric bisulfate; ceric perchlorate; ceric methanesulfonate; ceric trifluoromethanesulfonate; eerie chloride; eerie hydroxide; and eerie acetate.

25. The electronic device of claim 21, wherein the electronic device comprises an integrated circuit.

26. The electronic device of claim 21 comprising at least one of: (i) a transistor; (ii) a transistor comprising a metal gate; (iii) a transistor comprising titanium nitride; and (iv) a micro-electro-mechanical device.

27. The electronic device of claim 21 comprising at least one of: (i) a layer of silicon and a layer of silicon dioxide ($SiO_2$); (ii) a layer of titanium nitride (TiN); (iii) a source region of a transistor ion-implanted with a dopant; (iv) a drain region of a transistor ion-implanted with a dopant; and (v) a channel region of a transistor ion-implanted with a dopant.

28. A method for removing a photoresist from a substrate, the method comprising:
   contacting the photoresist with a solution comprising cerium;
   wherein, prior to contacting the photoresist with the solution, the photoresist has been ion-implanted by at least one of: (i) greater than approximately $5 \times 10^{14}$ ions per square centimeter; and (ii) ions having an average energy, before the ions impact the photoresist, greater than approximately 5 thousand electron volts; and
   wherein the substrate comprises titanium nitride.

29. The method of claim 28, wherein the cerium is comprised in a salt.

30. The method of claim 29, wherein the salt is cerium ammonium nitrate, $Ce(NH_4)_2(NO_3)_6$.

31. An electronic device formed by removing a photoresist from a substrate by:
   contacting the photoresist with a solution comprising cerium;
   wherein, prior to contacting the photoresist with the solution, the photoresist has been ion-implanted by at least one of: (i) greater than approximately $5 \times 10^{14}$ ions per square centimeter; and (ii) ions having an average energy, before the ions impact the photoresist, greater than approximately 5 thousand electron volts; and wherein the electronic device comprises titanium nitride.

32. The electronic device of claim 31, wherein the electronic device comprises at least one of: (i) a transistor; (ii) a transistor comprising a metal gate; (iii) a transistor comprising titanium nitride; (iv) an integrated circuit; and (v) a micro-electro-mechanical device.

33. The electronic device of claim 31, wherein the cerium is comprised in a salt.

34. The electronic device of claim 33, wherein the salt is cerium ammonium nitrate, $Ce(NH_4)_2(NO_3)_6$.

35. A method of forming an electronic device, the method comprising:

forming a substrate comprising titanium nitride;

ion-implanting photoresist by at least one of: (i) greater than approximately $5\times10^{14}$ ions per square centimeter; and (ii) ions having an average energy, before the ions impact the photoresist, greater than approximately 5 thousand electron volts; and contacting the photoresist with a solution comprising cerium.

36. The method of claim 35, wherein the electronic device comprises at least one of: (i) a transistor; (ii) a transistor comprising a metal gate; (iii) a transistor comprising titanium nitride; (iv) an integrated circuit; and (v) a micro-electro-mechanical device.

37. The method of claim 36, wherein the cerium is comprised in a salt.

38. The method of claim 37, wherein the salt is cerium ammonium nitrate, $Ce(NH_4)_2(NO_3)_6$.

* * * * *